US006245676B1

(12) United States Patent
Ueno (10) Patent No.: US 6,245,676 B1
(45) Date of Patent: Jun. 12, 2001

(54) METHOD OF ELECTROPLATING COPPER INTERCONNECTS

(75) Inventor: Kazuyoshi Ueno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/255,562

(22) Filed: Feb. 22, 1999

(30) Foreign Application Priority Data

Feb. 20, 1998 (JP) .................................................. 10-038311

(51) Int. Cl.7 .............................. H01L 21/44; C25D 5/18; C25D 7/12
(52) U.S. Cl. ........................ 438/687; 438/677; 438/678; 438/759; 205/103; 205/104; 205/157; 205/220; 205/222
(58) Field of Search .................................... 438/637–640, 438/643, 408, 676–678, 687, 759; 205/123, 133, 102–104, 157, 107–108, 200, 222

(56) References Cited

U.S. PATENT DOCUMENTS 5,972,192 * 10/1999 Dubin et al. .......................... 205/101

FOREIGN PATENT DOCUMENTS 57-71150   5/1982   (JP) .

* cited by examiner

*Primary Examiner*—Richard Booth
*Assistant Examiner*—Ha Tran Nguyen
(74) *Attorney, Agent, or Firm*—Hutchins, Wheeler & Dittmar (57) ABSTRACT

The flexibility of a wiring design is improved by preventing any erosion from happening upon forming a buried wiring. An interlayer insulating film is formed on a silicon substrate, and then trenches are formed in the interlayer insulating film. Thereafter, the barrier layer is deposited on side surfaces and a bottom surface in the trenches and on an entire area on the interlayer insulating film, and a copper seed layer is formed over an entire area on the barrier layer. Fountain plating is performed using the copper seed layer as an electrode to deposit the copper plated layer on the trenches and on a peripheral area of the same the copper plated layer buries the trenches and has a protruded configuration. Thereafter, the surface of the copper plated layer is polished with a CMP method until the interlayer insulating film is exposed to form a buried wiring.

9 Claims, 9 Drawing Sheets

METHOD OF ELECTROPLATING COPPER INTERCONNECTS

BACKGROUND OF THE INVENTION

1. Field of the Invention

The present invention relates to a method of manufacturing a semiconductor device, and more specifically to a method of manufacturing a semiconductor device in which flatness of the surface of an insulating film in a buried wiring formation area is ensured.

2. Description of the Related Art

In recent years, as semiconductor integrated circuits are made finer and are highly integrated, multilayering of wirings has been promoted. Under such circumstances, when a lower layer wiring is formed on a substrate interlayer insulating film formed on a semiconductor substrate and when an interlayer insulating film is deposited while covering the lower layer wiring, the surface of the interlayer insulating film formed on the lower layer wiring while covering the same is prevented from being flattened owing to a step between the ground interlayer insulating film and the lower layer wiring. Such unevenness of the interlayer insulating film formed on the lower layer wiring while covering the same prevents an upper layer wiring from being formed with high yield when the upper layer wiring is further formed on the interlayer insulating film. Accordingly, ensurance of flatness of the surface of the interlayer insulating film is important. For this, a buried wiring is formed in the interlayer insulating film to flatten the surface of the interlayer insulating film.

In the following, there will be described a method of forming a buried wiring with reference to FIGS. 9 and 10.

Figure 9A:
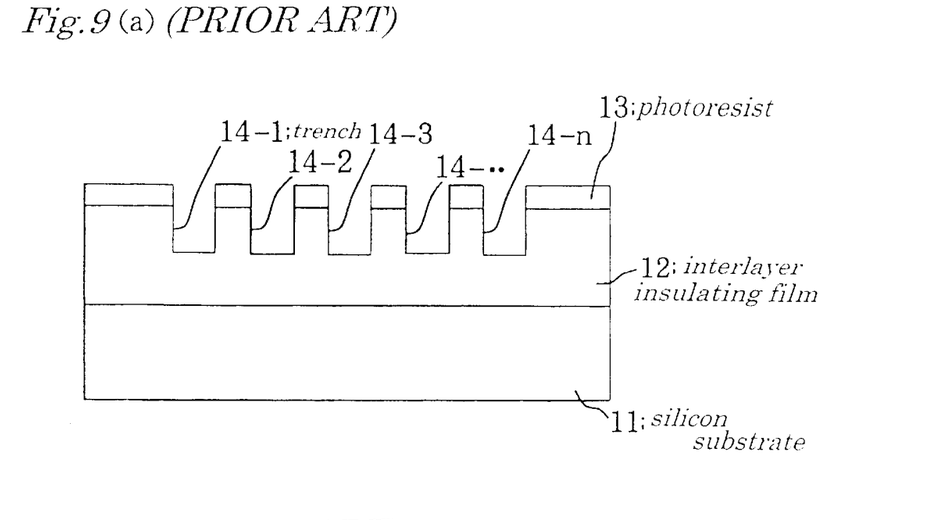
FIGS. 9(a) to 9(c) are cross sections of successive processes illustrating a prior method of manufacturing a semiconductor device.

Firstly, as illustrated in FIG. 9(a), an interlayer insulating film 12 comprising a silicon oxide film is formed on a silicon substrate 11, over the entire area on which film a photoresist 13 is in turn applied to form a resist pattern corresponding to a configuration of wirings to be formed using a photolithography process, which pattern is used as a mask to form in the interlayer insulating film 12 trenches 14-1, 14-2, 14-3, . . . , 14-n with about 0.5 μm depth, 0.3 to 10 μm width, and about 0.5 μm interval.

Figure 9B:
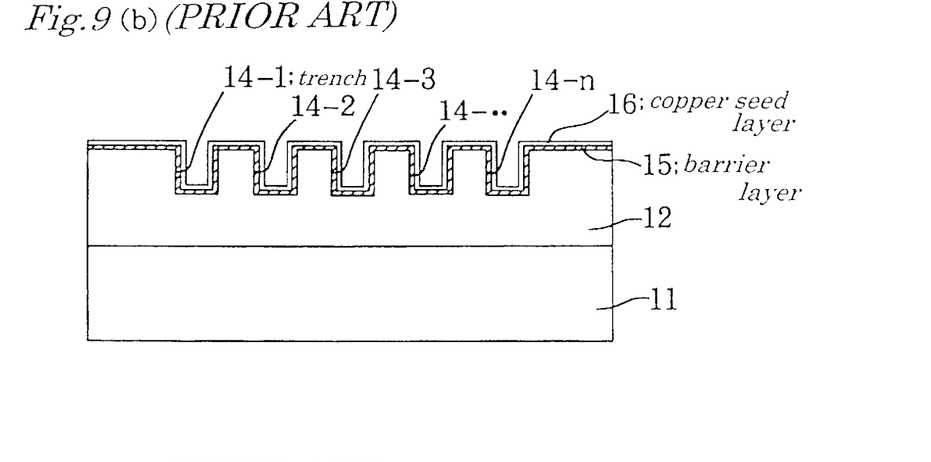
Figure 9C:
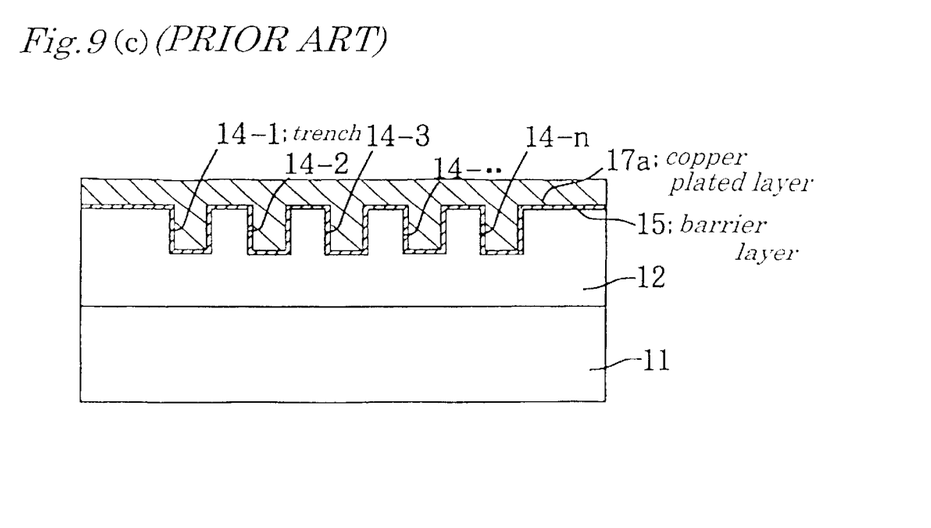

Thereafter, as illustrated in FIG. 9(b), the photoresist 13 is removed, and a tantalum (Ta) barrier layer 15 is deposited on side surfaces and on a bottom surface in the trenches 14-1 to 14-n and over the entire area on the interlayer insulating film 12, and further a copper seed layer 16 is formed over the entire area on the barrier layer 15. The deposition of the barrier layer 15 and the formation of the copper seed layer 16 are achieved respectively with a CVD method, a sputtering method, and the like, all well known. The barrier layer 15 is provided to prevent copper from diffusing into the silicon oxide film to produce a leakage current between the wirings or along a junction part in the silicon substrate.

Figure 1A:
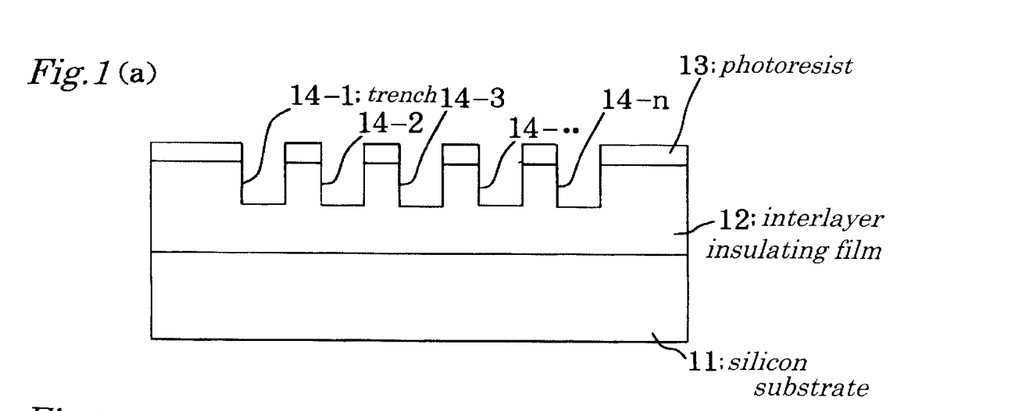
FIGS. 1(a) to 1(c) are cross sections of successive processes illustrating a first embodiment of a method of manufacturing a semiconductor device.
Figure 1B:
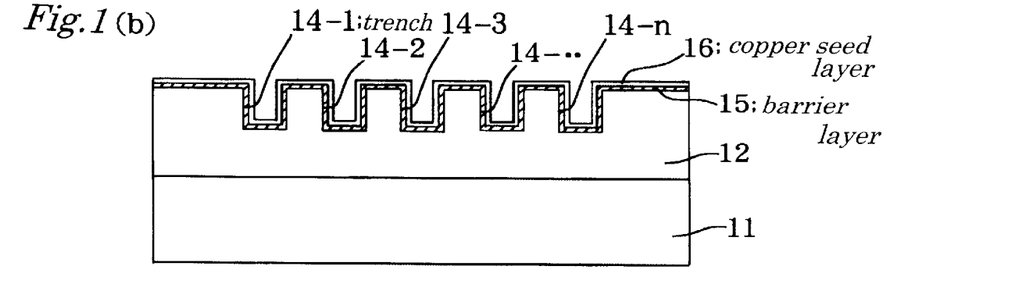
Figure 1C:
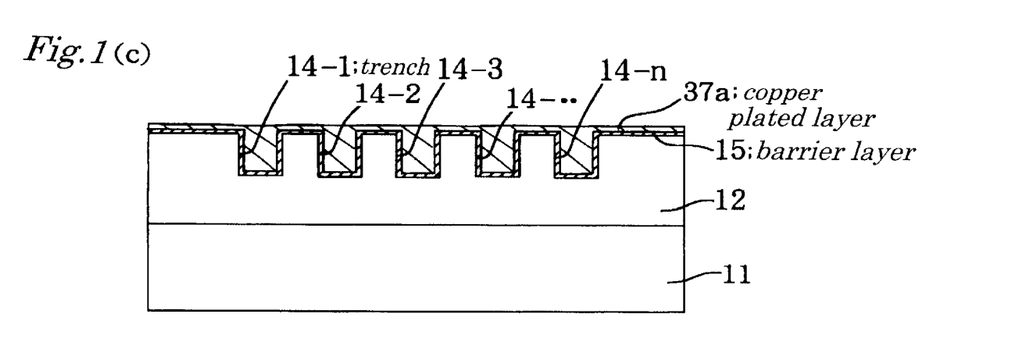

As illustrated in FIG. 1(c), with a fountain plating method where the copper seed layer 16 is used as an electrode a copper plating layer 17 is deposited, which buries the trenches 14-1 to 14-n and has a substantially flat surface over a wide area on the interlayer insulating film 12.

Figure 10:
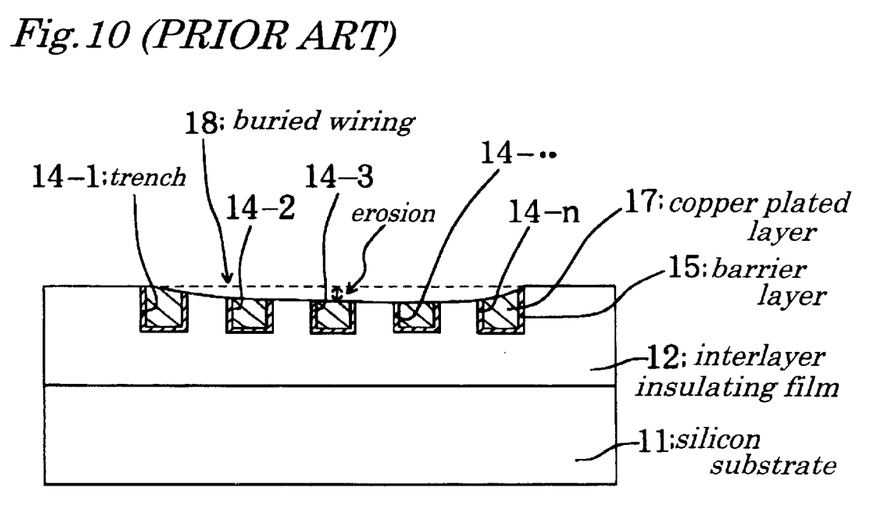
FIG. 10 is a cross section of a process illustrating the method of manufacturing a semiconductor device of FIG. 9.

As illustrated in FIG. 10, with chemical and mechanical polishing (CMP) the entire surface of the silicon substrate 11 on which the copper plated layer 17 is formed is polished until the interlayer insulating film 12 is exposed, to leave the copper plated layer 17 only in the trenches 14-1 to 14-n and hence form a buried wiring 18.

Figure 11:
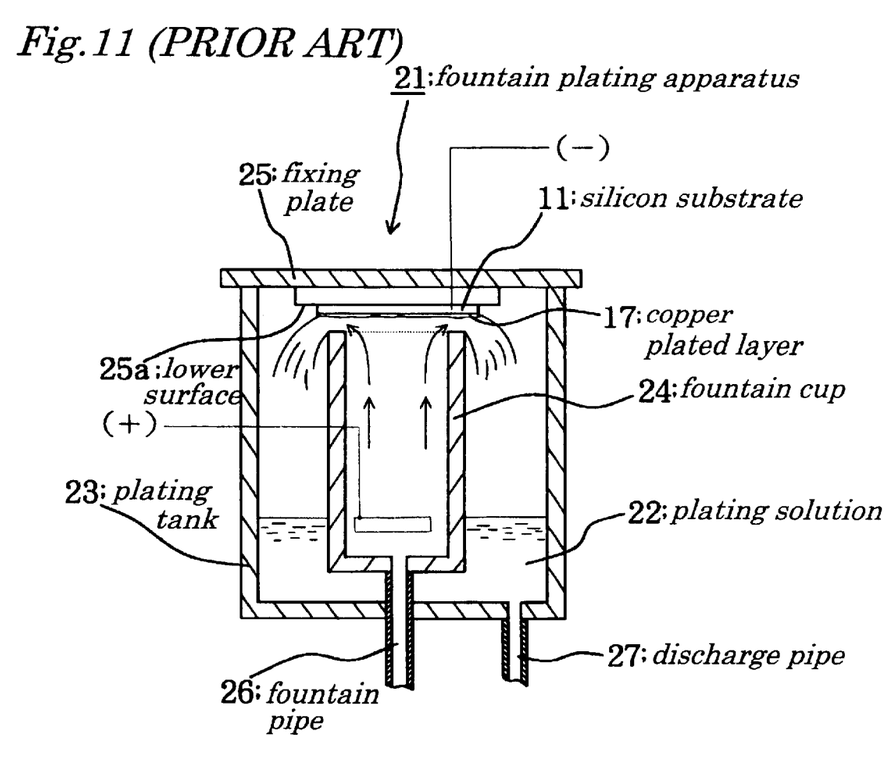
FIG. 11 is a view exemplarily illustrating the construction of an example of a fountain plating apparatus.

Referring now to FIG. 11, there will be described the fountain plating method in the process illustrated in FIG. 9(c). FIG. 11 is a schematical view exemplarily illustrating a fountain plating apparatus.

The fountain plating apparatus 21 includes as illustrated in the same figure a substantially cylindrical plating tank 23 for temporarily storing a plating solution 22 in which copper ion ($Cu^{2+}$) is dissolved, a cylindrical fountain cup 24 contained in the plating tank 23, a disk-shaped fixing plate 25 comprising an insulating material horizontally disposed slightly above the fountain cup 24, a plating solution fountaining fountain pipe 26 opened from a bottom surface of the fountain cap 24 upward at the center of the same, and a discharge pipe 27 for the plating solution 22 opened into the tank from a bottom surface of the plating tank 23. A pump and a plating solution tank are provided (not shown) outside the plating tank 23, and the plating solution 22 is introduced with use of the pump into the fountain cup 24 from the plating solution through the fountain pipe 26 and is returned from the plating tank 23 into the plating solution tank. The silicon substrate 11 is fixed to a lower surface 25a of a fixing plate 25 on which the copper plated layer 17 is to be deposited.

For forming the copper plated layer 17 on the silicon substrate 11 using the fountain plating apparatus 21 the silicon substrate 11 is first fixed to the lower surface 25a of the fixing plate 25, and then the fixing plate 25 to which the silicon substrate 11 is fixed is disposed horizontally at a predetermined position slightly above the plating solution 22, actuating the pump (not shown) to fountain the plating solution 22 from the fountain pipe 26. In this state, there is applied predetermined voltage where a fountain cup 24 side is set to be positive (+) and a silicon substrate 11 (copper seed layer 16) side is set to be negative (−) to conduct a current, and then a liquid level of the plating solution 22 is raised to fountain the plating solution 22 onto the surface of the silicon substrate 11 as indicated by an arrow whereby the copper plated layer 17 is deposited on the copper seed layer 16.

The plating solution 22 which has completed the deposition of the copper plated layer 17 overflows from an upper part of the fountain cup 24 to the side of the same. After the elapse of a predetermined time, the fountaining of the plating solution 22 is interrupted to lower the liquid level, and the fixing plate 25 is removed from the plating tank 23 and the silicon substrate 11 is removed from the silicon substrate 11. In such a manner, there is ensured the silicon substrate 11 where the copper plating tank 17 is deposited at a predetermined position. Although the aforementioned fountain plating apparatus 21 is an example where the fountain cup 24 is used as the positive electrode, another apparatus may be used in which a mesh electrode is provided in the fountain cup 24 to which positive voltage is applied, and in which the fountain cup 24 itself is not used as an electrode.

Although in the above description the fountain cup 24 side is set positive with the silicon substrate 11 side set negative, and predetermined voltage is applied thereacross to conduct a current, as described in Japanese Patent Laid-Open Application No. Sho57-71150, 1st to 7th lines on a left lower column, p.230, a plating speed at high current density is high in the fountain plating method so that no flat copper plated layer 17 is obtained when a fixed pattern current is conducted at all times.

To solve the problem there is known a plating solution (hereinafter, referred to a retarding agent) which is adsorbed at high current density portions on an exposed surface of the metal seed layer 16 or the copper plated layer 17 and into which there is added an additive that prevents copper from adhering to such portions (CubathM: trade name of ENTHONE OMI company, for example).

Figure 12:
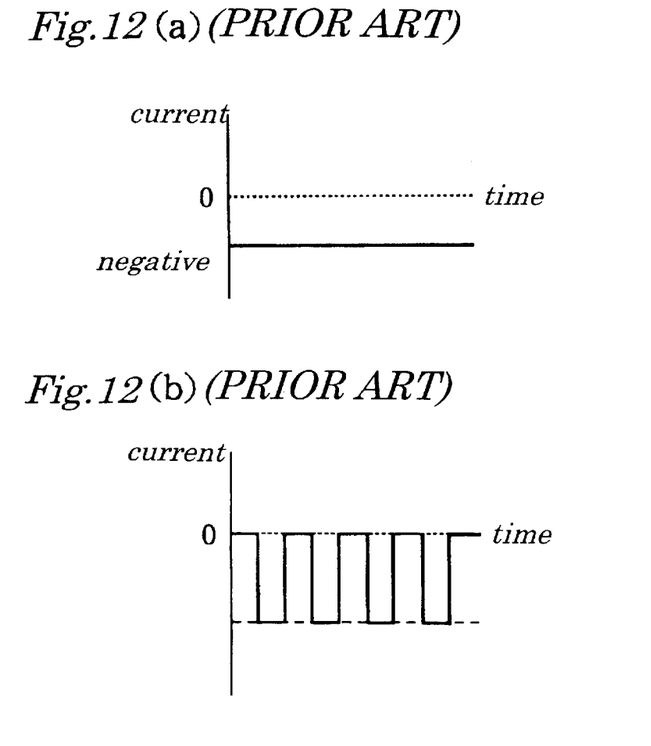

When a plating solution 22 containing such a retarding agent is used, the plating speed is slowed down automatically at high current density portions, so that a current having a unidirectional polarity at all times ensures a plated layer having a substantially flat surface. Accordingly, as illustrated in FIGS. 12(a) and (b), a negative DC current or negative DC pulsed current both having a unidirectional polarity is conducted to achieve fountain plating and hence ensure a copper plated layer 17 having a substantially flat surface.

Figure 14:
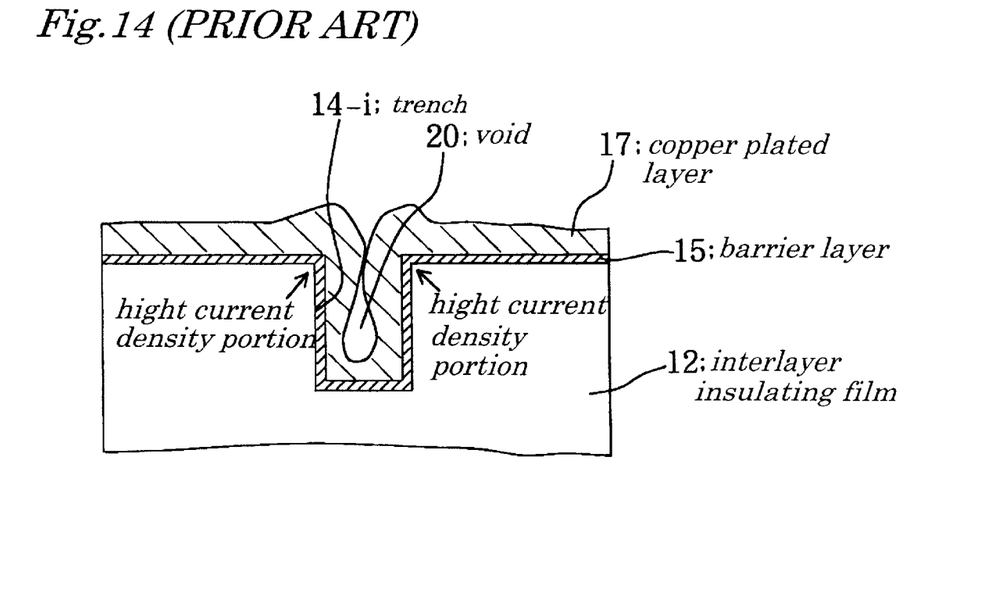
FIG. 14 is a view illustrating production of voids at high current density portions in deposition of a copper plated layer associated with the prior method of manufacturing a semiconductor device.

There may also be a situation where a plating solution is used to which the foregoing retarding agent is not added (Microfab: trade name of EEJA company, for example). Since a plating speed at high current density portions is high, conduction of a current always having a unidirectional polarity brings about a problem that film thickness is nonuniform, and further as illustrated in FIG. 14 deposits adhere to portions at opposite sides in the vicinity of an opening where current density is high before the trenches 14-i are buried to produce voids 20 in the buried layer in the trench and hence shorten the life of electromigration.

Figure 13:
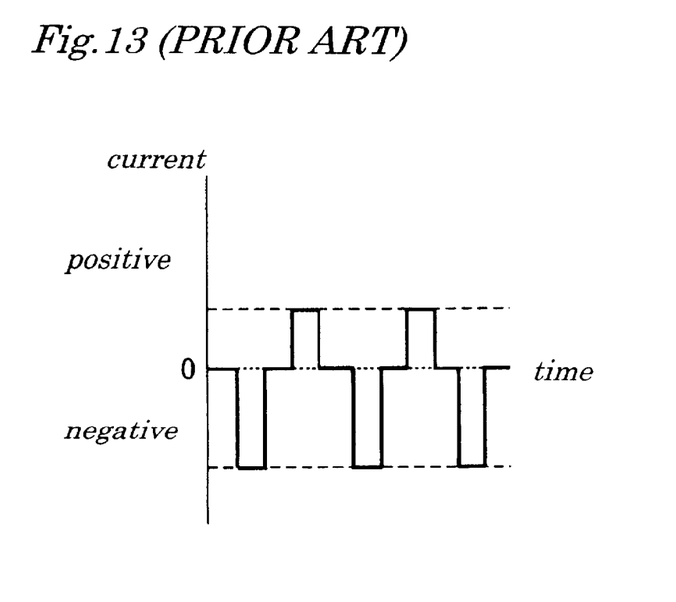
FIG. 13 is a view of a temporal waveform of a current upon fountain plating for illustrating the operation of the prior method of manufacturing a semiconductor device.

To solve the problem, a DC pulsed current having a forwardly and backwardly alternating polarity as illustrated in FIG. 13 is conducted to achieve fountain plating and hence obtain a substantially, flat surface copper plated layer 17.

Figure 15:
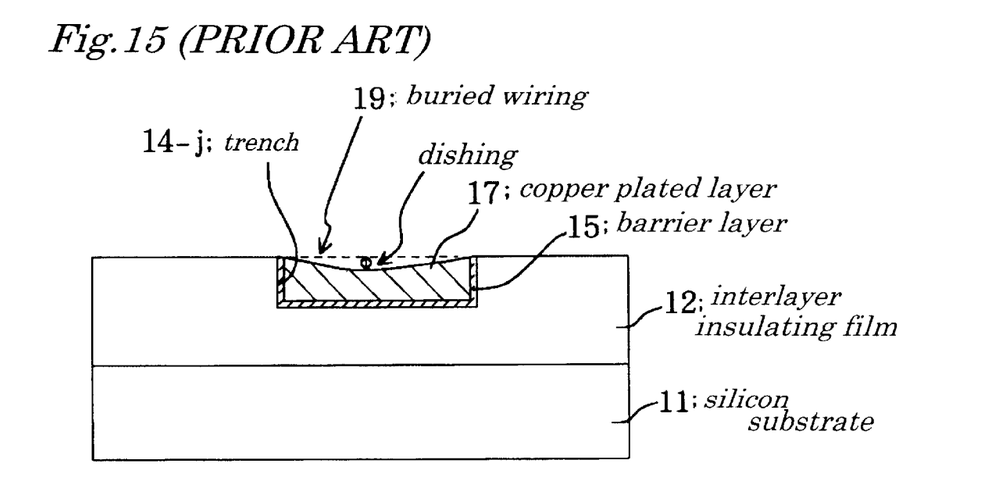
FIG. 15 is a cross section illustrating happening of dishing in the prior method of manufacturing a semiconductor device.

Such prior art as described above however suffers from a problem that when after the substantially flat surface copper plated layer 17 is obtained, polishing is applied to the surface and copper is left behind only in the trenches 14-1 to 14-n to form the buried wiring 18, erosion happens (a phenomenon where copper in a surface of a high wiring pattern density area is more polished and is indented) as illustrated in FIG. 10, and further when the copper plated layer 17 is buried in a wider trench 14-j to form the buried wiring 19 of a wider wiring pattern as illustrated in FIG. 15, dishing happens (a phenomenon where copper in a surface of a wider wiring pattern is more polished and indented) to limit the width of the wiring pattern and reduce the flexibility of a wiring design.

More specifically, in polishing with the CMP process, for leaving copper only in the trenches 14-1 to 14-n to form the buried wiring 18 while preventing the interlayer insulating film 12 from being reduced (within about 500 Angstrom), it is necessary to increase the polishing speed of the copper plated layer 17 than in the interlayer insulating film 12. For this, an acidic additive is added to an abrasive to oxidize copper into copper oxide whereby the copper is more rapidly polished than in the silicon oxide film.

Thus, when the interlayer insulating film 12 is exposed, the same is more removed at portions having a higher copper area ratio to result in the aforementioned erosion and dishing.

SUMMARY OF THE INVENTION

The present invention has been made to solve the aforementioned problems of the prior art, and has an object to provide a method of manufacturing a semiconductor device capable of preventing erosion and dishing from happening upon forming a buried wiring by providing a trench along a wiring scheduled portion of an insulating film and burying the trench with a metal wiring material and depositing the metal wiring material on the insulating film, and applying a flattening processing to the surface of the resulting sample, and capable of increasing the flexibility of a wiring design.

To achieve the aforementioned object, a method of manufacturing a semiconductor device, according to a first aspect of the present invention, is featured by comprising the steps of: providing a trench in a wiring scheduled portion of an insulating film formed on a substrate; forming a metal seed layer on the insulating film including the trench; forming a deposit layer of a metal wiring material on the metal seed layer to bury the trench with use of an electrical plating method where the metal seed layer is taken as one electrode; and then polishing and removing the deposit layer of the metal wiring material until the insulating film is again exposed to form a buried wiring in the trench, the improvement being wherein the method further comprises the steps of: protruding the deposit layer of the metal wiring material on the trench and on a periphery of the trench into a protruded configuration by controlling a current in the electrical plating method upon forming the buried wiring, and then polishing and removing the deposit layer until the insulating film is exposed.

Also, a method of manufacturing a semiconductor device, according to a second aspect of the present invention, is featured by that in the electrical plating according to the first aspect of the present invention a bidirectional current alternately temporarily changing in its flow direction is conducted until at least the trench is buried, and then a unidirectional current not changing in its flow direction is conducted to protrude the deposit layer of the metal wiring material into a protruded configuration on the trench and on a peripheral area of the same, and then polish and remove the deposit layer until the insulating film is exposed.

Also, a method of manufacturing a semiconductor device, according to a third aspect of the present invention, is featured by that in the method of manufacturing a semiconductor device according to the first aspect of the present invention the plating solution used for the electrical plating method includes a retarding agent that prevents or retards the metal wiring material from adhering to a high current density portion on the exposed surface of the metal seed layer or the deposit layer.

Also, a method of manufacturing a semiconductor device, according to a fourth aspect of the present invention, is featured by that in the method of manufacturing a semiconductor device according to the third aspect of the present invention the unidirectional current not changing in its flow direction is conducted until the trench is at least buried, and then the bidirectional current alternately temporarily changing in its flow direction is conducted to protrude the deposit layer of the metal wiring material on the trench and on a peripheral area of the same into a protruded configuration and then polish and remove the deposit layer until the insulating film is exposed.

A method of manufacturing a semiconductor device, according to a fifth aspect of the present invention is featured by comprising the steps of: providing a trench along a wiring scheduled portion of an insulating film formed on a substrate; forming a metal seed layer on the insulating film including the trench; forming a deposit layer of a metal wiring material on the metal seed layer to bury the trench with the aid of an electrical plating method where a unidirectional current not temporarily changing in its flow direction is conducted using the metal seed layer as one electrode, and then polishing and removing the deposit layer of the metal wiring material until the insulating film is again exposed to form a buried wiring in the trench, the improvement being wherein the method further comprises the steps of: first achieving previous process electrical plating until the trench is at least buried using a first plating solution containing a retarding agent to prevent or retard the metal wiring material from adhering to a high current density portion on the exposed surface of the metal seed layer or the deposit layer upon forming the buried wiring, and then achieving later process electrical plating using a second plating solution not containing the retarding agent to protrude the deposit layer of the metal wiring material on the trench and on a peripheral area of the same into a protruded configuration, and thereafter polishing and removing the deposit layer until insulating layer is exposed.

A method of manufacturing a semiconductor device, according to a sixth aspect of the present invention, is featured by comprising the steps of: providing a trench along a wiring scheduled portion of an insulating film formed on a substrate; forming a metal seed layer on the insulating film including the trench; forming a deposit layer of a metal wiring material on the metal seed layer with the aid of an electrical plating method where a bidirectional current alternately temporally changing in its flow direction is conducted using the metal seed layer as one electrode to bury the trench; and thereafter polishing and removing the deposit layer of the metal wiring material until the insulating film is again exposed to form a buried wiring in the trench, the improvement being wherein the method further comprises the steps of: upon forming the buried wiring, protruding the deposit layer of the metal wiring material on the trench and on a peripheral area of the same into a protruded configuration by first achieving previous process electrical plating until the trench is at least buried using a second plating solution not containing a retarding agent for preventing the metal wiring material from adhering to a high current density portion on the exposed surface of the metal seed layer or the deposit layer upon forming the buried wiring, and then achieving later process electrical plating using a first plating solution containing the retarding agent; and polishing and removing the deposit layer until the insulating film is exposed.

A method of manufacturing a semiconductor device, according to a seventh aspect of the present invention, is featured by comprising the steps of: providing a trench along a wiring scheduled portion of an insulating film formed on a substrate; forming a metal seed layer on the insulating film including the trench; forming the deposit layer of the metal wiring material on the metal seed layer with the aid of an electrical plating method where the metal seed layer is used as one electrode; and then polishing and removing the deposit layer of the metal wiring material until the insulating film is again exposed to form a buried wiring in the trench, the improvement being wherein the method further comprises the steps of: first forming a deposition prevention layer on an area excepting at least the trench in the area on the insulating film upon forming the buried wiring; then protruding the deposit layer of the metal wiring material on the trench and on a peripheral area of the same into a protruded configuration with the aid of the electrical plating; and thereafter polishing and removing the deposit layer until the insulating film is exposed and thereafter polishing and removing the deposit layer until the insulating film is exposed.

A method of manufacturing a semiconductor device, according to a eighth aspect of the present invention, is featured by comprising the steps of: providing a trench along a wiring scheduled portion of an insulating film formed on a substrate; forming a metal seed layer on the insulating film including the trench; forming a deposit layer of a metal wiring material on the metal seed layer to bury the trench with the aid of an electrical plating method where the metal seed layer is used as one electrode; and thereafter polishing and removing the deposit layer of the metal wiring material until the insulating film is again exposed, the improvement being wherein the method further comprises the steps of: upon forming the buried wiring, protruding the deposit layer of the metal wiring material on the trench and on a peripheral area of the same into a protruded configuration by first forming a deposit layer of the metal wiring material on the insulating film with the aid of the electrical plating method upon forming the buried wiring, and then forming a mask layer at least on an area on the trench in an area on the deposit layer for preventing the deposit layer of the metal wiring material from being etched, and then applying the etching processing; and then polishing and removing the deposit layer until the insulating film is exposed.

A method of manufacturing a semiconductor device, according to the ninth aspect of the present invention, is featured by comprising the steps of: providing a trench along a wiring scheduled portion of an insulating film formed on a substrate; forming a metal seed layer on the insulating film including the trench; forming a deposit layer of a metal wiring material on the metal seed layer to bury the trench using an electrical plating method where the metal seed layer is used as one electrode; and thereafter polishing and removing the deposit layer of the metal wiring material until the insulating film is again exposed to form a buried wiring in the trench, the improvement being wherein the method further comprises the steps of: upon forming the buried wiring, first forming the deposit layer of the metal wiring material on the insulating film to be thin with the aid of the electrical plating method or forming the deposit layer of the metal wiring material on the insulating film with the aid of the electrical plating method and then etching back the deposit layer into a thin deposit layer; then protruding the deposit layer of the metal wiring material on the trench and on a peripheral area of the same into a protruded configuration with the aid of electrical plating where a bidirectional current alternately temporarily changing in its flow direction is conducted using a first plating solution containing a retarding agent for preventing the metal wiring material from adhering to a high current density portion on an exposed surface of the metal seed layer or the deposit layer; and then polishing and removing the deposit layer until the insulating film is exposed.

A method of manufacturing a semiconductor device, according to a tenth aspect of the present invention, is featured by comprising the steps of: providing a trench along a wiring scheduled portion of an insulating film formed on a substrate; forming a metal seed layer on the insulating film including the trench; forming a deposit layer of a metal wiring material on the metal seed layer to bury the trench with the aid of an electrical plating method where the metal seed layer is used as one electrode; and thereafter polishing and removing the deposit layer of the metal wiring material until the insulating film is again exposed to form a buried wiring in the trench, the improvement being wherein the method further comprises the steps of: upon forming the buried wiring, forming the deposit layer of the metal wiring material on the insulating film to be thin with the aid of the electrical plating method upon forming the buried wiring or forming the deposit layer of the metal wiring material on the insulating film with the aid of the electrical plating method and then etching back the deposit layer into a thin deposit layer; then protruding the deposit layer of the metal wiring material on the trench and on a peripheral area of the same into a protruded configuration with the aid of electrical plating where a unidirectional current not temporally changing in its flow direction is conducted using a second plating solution not containing a retarding agent for preventing the metal wiring material from adhering to a high current density portion on an exposed surface of the metal seed layer or the deposit layer; and thereafter polishing and removing the deposit layer until the insulating film is exposed.

In addition, a method of manufacturing a semiconductor device, according to a eleventh aspect of the present invention, is featured by that the electrical plating method according to the method of manufacturing a semiconductor device of any one of the first to the tenth aspects of the present invention is a fountain plating method where the plating solution is fountained to the metal seed layer formed on the substrate in a fountain state.

BRIEF DESCRIPTION OF THE DRAWINGS

The above and other objects, advantages and features of the present invention will be more apparent from the following description taken in conjunction with the accompanying drawings in which:

FIGS. 12(a), (b) are views of temporal waveforms of a current upon fountain plating for illustrating the operation of the prior method of manufacturing a semiconductor device;

DESCRIPTION OF THE PREFERRED EMBODIMENTS

Figure 2:
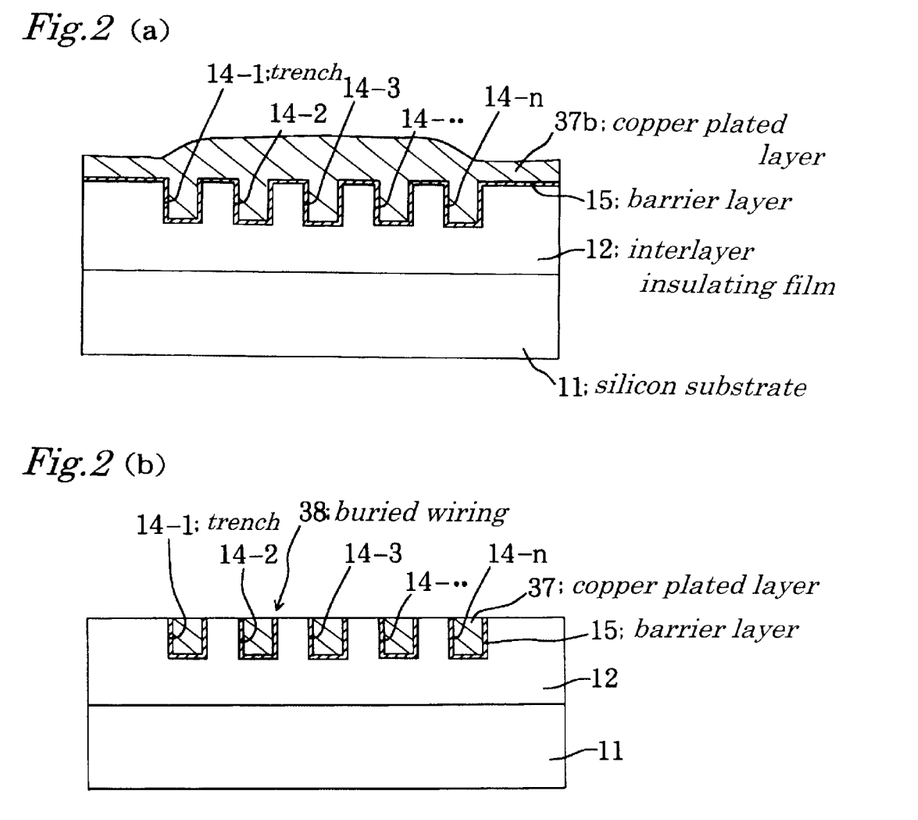
FIGS. 2(a), 2(b) are cross sections illustrating successive processes of a method of manufacturing a semiconductor device.
Figure 3:
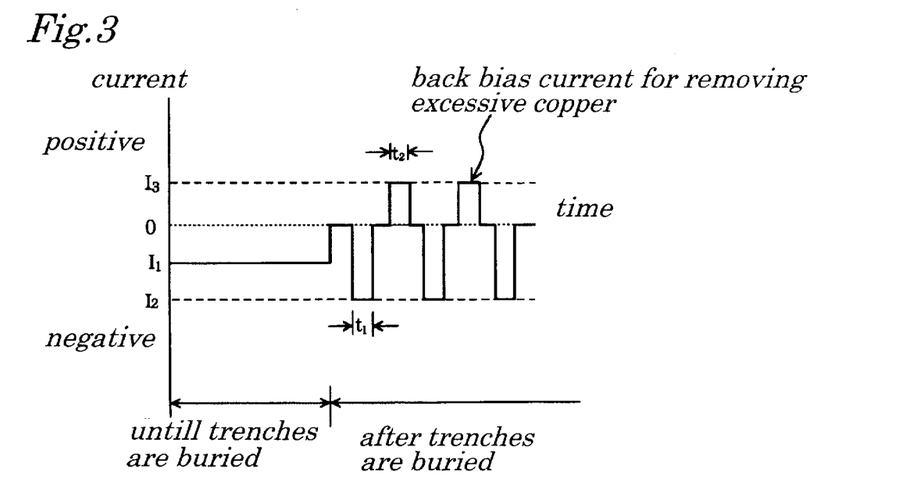
FIG. 3 is a view of a waveform of a current upon fountain plating illustrating the operation of the embodiment of FIG. 1.

In what follows, there will be described in more detail various preferred embodiments of the present invention with reference to the accompanying drawings FIGS. 1, 2 are views of cross sections of successive processes each illustrating a first embodiment of a method of manufacturing a semiconductor device of the present invention, and FIG. 3 is a view of a temporal waveform of a current upon fountain plating illustrating the operation of the first embodiment.

The method of manufacturing a semiconductor device of the present embodiment is sharply different from that of a prior art (refer to FIGS. 9, 10) in the following: upon depositing copper plated layers 37a, 37b a substantially flat copper plated layer is formed by conducting a unidirectional polarity DC current (unidirectional current not temporally changing in its flow direction) until trenches 14-1 to 14-n are buried with the copper plated layers. After the trenches 14-1 to 14-n are buried, a DC pulse current changing alternately: forwardly and backwardly in its polarity (bidirectional current alternately temporally changing in its flow direction) is conducted for fountain plating to deposit the copper plated layer 37a on the trenches 14-1 to 14-n and on a peripheral area of the same into a more protruded configuration than other areas as illustrated FIG. 2(a). Herein, like symbols will be applied to like constituent parts as in those of the aforementioned prior art, and the description will be omitted.

For achieving the present exemplary method of manufacturing a semiconductor device, as illustrated in FIG. 1(a), an interlayer insulating film 12 is first formed on a silicon substrate 11, over the entire area of which a photoresist 13 is in turn applied to form a resist pattern, and then trenches 14-1 to 14-n are formed along a wiring scheduled portion of the interlayer insulating film 12. Thereafter, as illustrated in FIG. 1(b), the photoresist 13 is removed, and a barrier layer 15 is deposited on side surfaces and a bottom surface in the trenches 14-1 to 14-n and over an entire area on the interlayer insulating film 12, and a copper seed layer 16 is formed over an entire area on the barrier area 15. The above description is substantially the same as that of the aforementioned prior method of manufacturing a semiconductor device.

Then, the silicon substrate 11 where the copper seed layer 16 has been finished is fixed to a lower surface 25a of a fixing plate 25 of a fountain plating apparatus 21 illustrated in FIG. 11, and the fixing plate 25 is disposed horizontally at a predetermined position slightly above a liquid level of a plating solution 22. A fountain cup 24 is used as one electrode with the silicon substrate 11 (copper seed layer 16) used as the other electrode, and predetermined voltage is applied between the foregoing electrodes to conduct a current whereby a pump (not shown) is activated to fountain the plating solution 22 from a fountain pipe 26 to the surface of the silicon substrate 11 and hence deposit the copper plated layer 37a on the copper seed layer 16.

After the elapse of predetermined time, fountaining the plating solution 22 is interrupted to lower a liquid level, and the fixing plate 25 is taken out from a plating tank 23 to demount the silicon substrate 11 from the fixing plate 25.

In the present embodiment, the deposition of the copper plated layer is achieved with the aid of a fountain plating method using a plating solution (first plating solution) containing a retarding agent which adsorbs an exposed surface of the metal seed layer 16 or the copper plated layer 17 along a high current density portion for preventing copper from adhering to that portion.

Since the retarding agent is contained, a plating speed along the high current density portion is automatically retarded. Thus, a substantially flat surface copper plated layer is formed by conducting a unidirectional polarity DC current.

More specifically, as illustrated in FIG. 3, in a previous process until the trenches 14-1 to 14-n are buried a unidirectional polarity negative DC current is conducted to achieve fountain plating. Hereby, as illustrated in FIG. 1(c), a substantially flat surface copper plated layer 37a with which the trenches 14-1 to 14-n are buried is deposited on the interlayer insulating film 12.

Although in the present embodiment the unidirectional polarity negative DC current is conducted in order to deposit the substantially flat copper plated layer, when there is a fear of voids being produced in the buried layer in the trench because the operation of the retarding agent is unsatisfactory, in order to eliminate the production of the voids the current is once interrupted and then a pulsed current flowing oppositely to that of the foregoing negative DC current is conducted whereby any corner of an opening of the trench (hole) is removed to prevent any pinch-off from being produced at the opening which might cause a trouble. Hereupon, a deposition rate of copper at the opening is higher than that at a bottom in the trench (hole), so that it is necessary to construct a deposition configuration of copper such that the configuration is not a reverse tapered cross section (narrower at the opening than at the bottom).

Thereafter, a plating current pattern is changed over and the fountain plating is continued. More specifically, as illustrated in FIG. 3, in a latter process after the trenches 14-1 to 14-n are buried a DC pulsed current alternately, i.e., forwardly backwardly changing in its polarity is conducted for the fountain plating.

Herein, a positive pulsed current is a back bias current to remove additive molecules that are adsorbed at a high current density portion, and hence the copper plated layer is more deposited at a high current density portion by conducting the positive pulsed current.

After the copper plated layer 37a is deposited in a configuration shown in FIG. 1(c), film thickness of the copper at the trenches 14-1 to 14-n is larger than that on the interlayer insulating film 12 to relatively lower resistance and hence increase a current amount. Hereby, the amount of the deposition of the copper at the trenches 14-1 to 14-n is increased.

Hereby, as illustrated in FIG. 2(a), a copper plated layer 37b on the trenches 14-1 to 14-n and on a peripheral area of the same more protruded than other areas is deposited. More specifically, upon flattening processing with a CMP process performed thereafter copper set higher in a polishing rate compared with the interlayer insulating film is formed thicker at a portion where an area ratio is high.

Then, as illustrated in FIG. 2(b), there is polished the surface of the silicon substrate 11 where the copper plated layer 37b is polished using the CMP method until the interlayer insulating film 12 is exposed, and the copper plated layer 37 is left behind only in the trenches 14-1 to 14-n and the buried wiring 38 is formed. Erosion has not happened. Although the present embodiment is with a high wiring density case, the same result shall be applied for a case where a buried wiring of a wider wiring pattern is formed, and thereupon dishing does not happen.

Therefore, according to the present exemplary construction, a trench is provided along a wiring scheduled portion of the interlayer insulating film, and a copper plated layer is buried in the trench and is deposited on the interlayer insulating film, to a surface of which a flattening processing is applied to form a buried wiring. Thereupon, erosion and dishing are prevented from happening, and hence freedom of a wiring design is increased.

Periods t1, t2 of the pulsed current having an alternately, forwardly and backwardly changing polarity shown in FIG. 3 are set within about 10 seconds.

This is because there is a fear that if the periods exceed about 10 seconds, the configuration of the copper plated layer is changed when the additive molecule is adsorbed and removed at a high current density portion. A peak value I2 of the negative pulsed current is set 0.8 to 1.2 A/dm$^2$, and a negative DC current value I1 and a positive pulsed current peak value I3 are set about ½ of I2.

As a modified example of the present embodiment, the current pulse may be changed such that the plating is interrupted and the deposition configuration of copper does not become a reverse tapered cross section (narrower at the opening rather than at the lower part).

Figure 4:
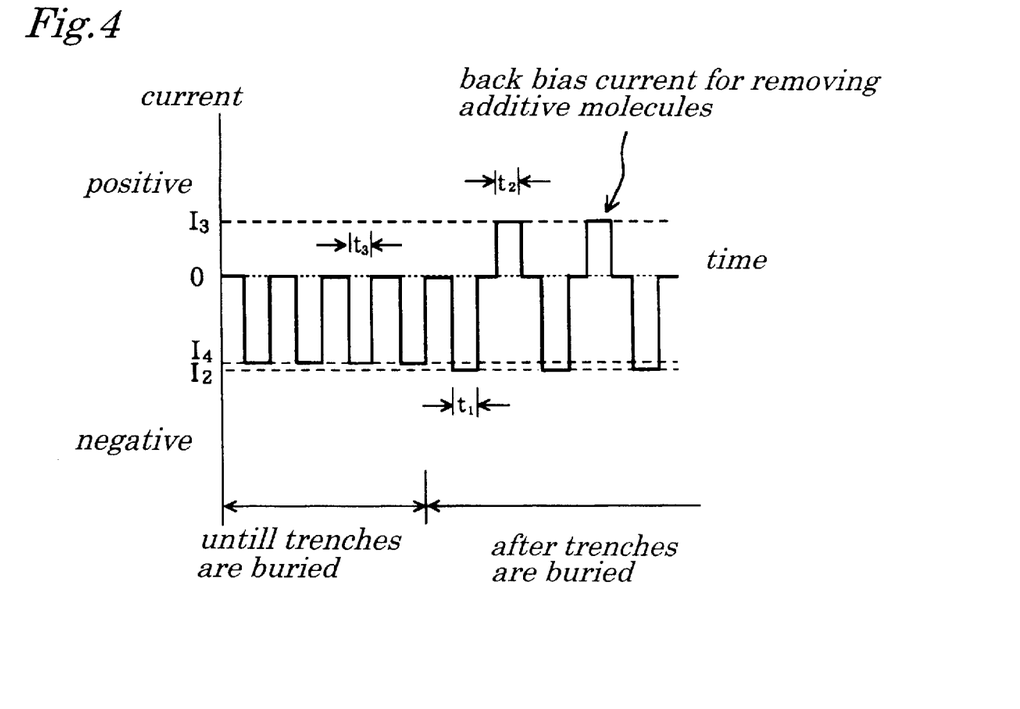
FIG. 4 is a view of a waveform of a current upon fountain plating illustrating the operation of a second embodiment of the present invention.

FIG. 4 is a view of a temporal waveform of a current upon fountain plating for illustrating the operation of a second preferred embodiment.

A method of manufacturing a semiconductor device of the present embodiment is sharply different from that of the first embodiment (refer to FIGS. 1, 2, 3.) in that there are different plating current patterns thereof flowed until the trenches 14-1 to 14-n are buried from each other.

More specifically, in the previous process until the trenches 14-1 to 14-n are buried, as illustrated in FIG. 4, fountaining plating is achieved by conducting a unidirectional polarity negative DC pulsed current (unidirectional current not temporally changing in its flow direction). Hereby, as illustrated in FIG. 1(c) there is deposited the copper plated layer 37a on the interlayer insulating film 12 which layer buries the trenches 14-1 to 14-n and has a flat surface.

Thereafter, the plating current pattern is changed over to continue the fountain plating.

More specifically, in the later process after the trenches 14-1 to 14-n are buried, as illustrated in FIG. 4, the fountain plating is achieved by conducting a DC pulsed current having alternately: forwardly and backwardly changing polarity. Hereby, as illustrated in FIG. 2(a), a copper plated layer 37b having a more protruded configuration on the trenches 14-1 to 14-n and on a peripheral area of the same than on other areas. With the present exemplary construction, there is ensured substantially the same effect as that described above in the first embodiment.

The period t3 of the negative DC pulsed current illustrated in FIG. 4 is set within about 10 seconds, and a peak value I4 of the negative DC pulsed current is set slightly lower than a peak value I2 of the negative pulsed current.

Figure 5:
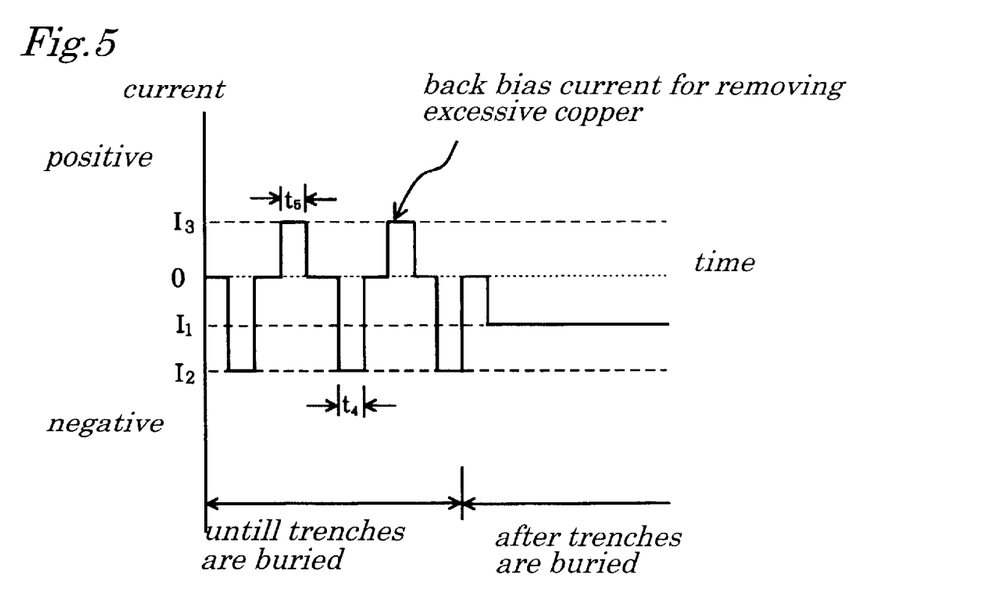
FIG. 5 is a view of a waveform of a current upon fountain plating illustrating the operation of a third embodiment of the present invention.

FIG. 5 is a view of a temporal waveform of a current upon fountain plating for illustrating the operation of a third preferred embodiment.

A method of manufacturing a semiconductor device of the present embodiment is sharply different from that of the first embodiment (FIGS. 1, 2, 3) in that a plating solution (second plating solution) to which the aforementioned retarding agent is not added is used to achieve fountain plating for deposition of a copper plated layer. Hereby, the order of changeover among plating current patterns of the present embodiment becomes different from that of the first embodiment.

Since no retarding agent is contained in the plating solution 22 in the present embodiment, a plating speed at a high current density portion is high.

Although already described, this situation brings about inconvenience that conduction of the unidirectional polarity DC current makes film thickness nonuniform and the life of electromigration is deteriorated. To prevent this, a DC pulsed current having an alternately: forwardly and backwardly changing polarity is conducted to deposit a flat surface copper plated layer. A positive pulsed current is a back bias current to remove excessive copper deposited at a high current density portion.

More specifically, in a previous process until the trenches 14-1 to 14-n are buried, as illustrated in FIG. 5, a DC pulsed current having an alternately: forwardly and backwardly changing polarity is conducted to achieve fountain plating. Hereby, as illustrated in FIG. 1(c), a copper plated layer 37a is deposited on the interlayer insulating film 12 which layer buries the trenches 14-1 to 14-n and has a substantially flat surface.

It is noted that a pattern of the DC pulsed current having an alternately: forwardly and backwardly changing polarity may be altered in proper in view of preventing production of voids.

Thereafter, the plating current pattern is changed over to continue fountain plating. More specifically, in a later process after the trenches 14-1 to 14-n are buried, as illustrated in FIG. 5, a unidirectional polarity negative DC current is conducted to achieve fountain plating.

Since no retarding agent is contained in the plating solution 22, a copper plated layer is more protruded and deposited at a high current density portion. Thus, after a copper plated layer 37a configured as illustrated in FIG. 1(c) is deposited, film thickness of copper in the trenches 14-1 to 14-n becomes thicker than that of an upper part of the interlayer insulating film 12 to relatively reduce the resistance, resulting in an increase of the amount of the current, and hence the amount of deposition of copper on the upper part of the trenches 14-1 to 14-n is increased.

Hereby, as illustrated in FIG. 2(a), there is deposited the copper plated layer 37b more protruded on the trenches 14-1 to 14-n and on a peripheral area of the same than on other areas.

Thus, with the present construction, substantially the same effect as that described above in the first embodiment is ensured.

Periods t4, t5 of a DC pulsed current having alternately: forwardly and backwardly changing polarity in FIG. 5 is set within about 10 seconds. This is because that there is a fear that if the periods exceed 10 seconds, the configuration of the copper plated layer is changed when excessive copper deposited at the high current density portion is deposited at the high current density portion or removed.

Figure 6:
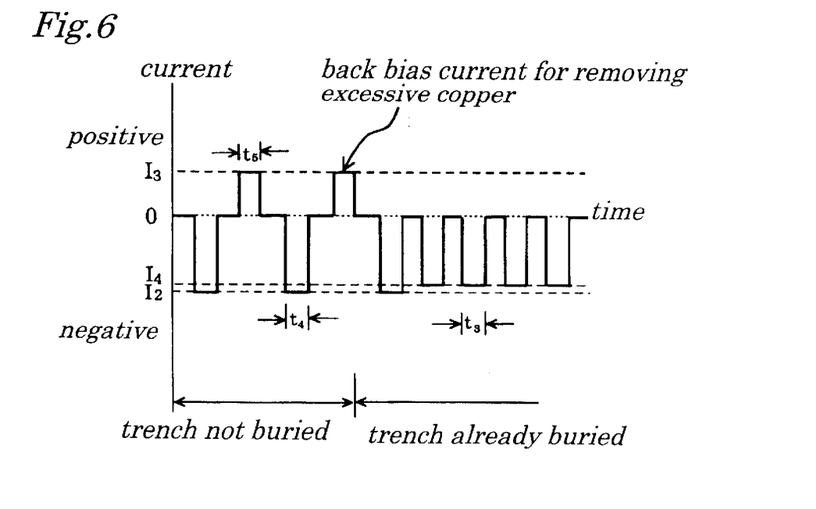
FIG. 6 is a view of a waveform of a current upon fountain plating illustrating the operation of a fourth embodiment of the present invention.

FIG. 6 is a view of a temporal waveform of a current upon fountain plating for illustrating the operation of a fourth preferred embodiment.

A method of manufacturing a semiconductor device according to the present embodiment is different from the third embodiment in that there are different plating current.

More specifically, in a previous process until the trenches 14-1 to 14-n are buried, as illustrated in FIG. 6, a DC pulsed current having an alternately:

forwardly and backwardly alternately changing polarity is conducted for fountain plating. Hereby, as illustrated in FIG. 1(c), a copper plated layer 37a is deposited on the interlayer insulating film 12 which layer buries the trenches 14-1 to 14-n and has a substantially flat surface.

Thereafter, the plating current pattern is changed over to continue fountain plating. More specifically, in a later process after the trenches 14-1 to 14-n are buried, as illustrated in FIG. 6, a negative DC pulsed current having a unidirectional polarity is conducted for fountain plating.

Hereby, as illustrated in FIG. 2(a), a copper plated layer 37b is deposited on the trenches 14-1 to 14-n and on a peripheral area of the same which layer has a more protruded configuration than on other areas is increased.

Accordingly, with the present construction, substantially the same effect as described above in the first embodiment is ensured.

A method of manufacturing a semiconductor device according to a fifth preferred embodiment is sharply different from that of the first embodiment (FIGS. 1, 2 and 3) in that in the first embodiment the kind of the plating solution is fixed and the plating current pattern is changed over for protrusion and deposition of the copper plated layer while in the present embodiment the plating current pattern is fixed and the kind of the plating solution is changed for protrusion and deposition of the copper plated layer.

More specifically, a unidirectional polarity negative DC current or negative DC pulsed current has been conducted at all times (current patterns shown in FIGS. 3 and 4). In a previous process until the trenches 14-1 to 14-n are buried, a plating solution 22 containing a retarding agent is used to achieve fountain plating. Since the plating solution 22 contains the retarding agent, a plating speed at a high current density portion is automatically slowed down.

Hereby, as illustrated in FIG. 1(c), a copper plated layer 37a is deposited on the interlayer insulating film 12 which layer buries the trenches 14-1 to 14-n and has a substantially flat surface.

Thereafter, in a later process after the trenches 14-1 to 14-n are buried, the plating solution 22 is changed over to a solution not containing a retarding agent to continue fountain plating. Since the plating current pattern is a unidirectional polarity negative DC current or negative DC pulsed current as described above, the copper plated layer is more protruded and deposited along a high current density portion.

Accordingly, after the copper plated layer 37a illustrated in FIG. 1(c) is deposited, film thickness of copper in the trenches 14-1 to 14-n becomes thicker than that on the interlayer insulating film 12 to relatively lower resistance and hence increase the amount of the current. Thus, the amount of the deposition of copper on the upper part of the trenches 14-1 to 14-n.

Hereby, as illustrated in FIG. 2(a), a copper plated layer 37b is deposited on the trenches 14-1 to 14-n and on a peripheral area of the same into a more protruded configuration than on other areas is increased.

With the present construction, substantially the same effect as described above in the first embodiment is ensured.

A method of manufacturing a semiconductor device according to a sixth preferred embodiment deposits a copper plated layer by fixing a plating current pattern and changing kinds of plating solutions in the same manner as in the fifth embodiment, but is different from the same in a plating current pattern.

More specifically, a DC pulsed current having an alternately: forwardly and backwardly alternately changing polarity has been conducted (a current pattern until the trenches illustrated in FIGS. 5 and 6 are buried.).

In a previous process until the trenches 14-1 to 14-n are buried, fountain plating is achieved using a plating solution not containing a retarding agent. In this case, a positive pulsed current is a back bias current for removing excessive copper deposited at high current density portions. Hereby, as illustrated in FIG. 1(c), a copper plated layer 37a is deposited on the interlayer insulating film 12 which layer buries the trenches 14-1 to 14-n and has a substantially flat surface.

Thereafter, in a later process after the trenches 14-1 to 14-n are buried, the plating solution 22 is changed over to a solution containing a retarding agent to continue fountain plating. Herein, the positive pulsed current is a back bias current for removing additive molecules adsorbed at high current density portions, and the copper plated layer is more deposited at high current density portions by conducting the positive pulsed current.

Accordingly, after the copper plated layer 37a having a configuration illustrated in FIG. 1(c) is deposited, film thickness of copper in the trenches 14-1 to 14-n becomes thicker than that on the interlayer insulating film 12 to relatively lower resistance and hence increase the amount of the current. Thus, the amount of deposition of copper on the upper part of the trenches 14-1 to 14-n.

Hereby, as illustrated in FIG. 2(a), a copper plated layer 37b is deposited on the trenches 14-1 to 14-n and on a peripheral area of the same which layer has a more protruded configuration than on other areas.

Thus, with the present exemplary construction, substantially the same effect as described above in the first embodiment is ensured.

Figure 7:
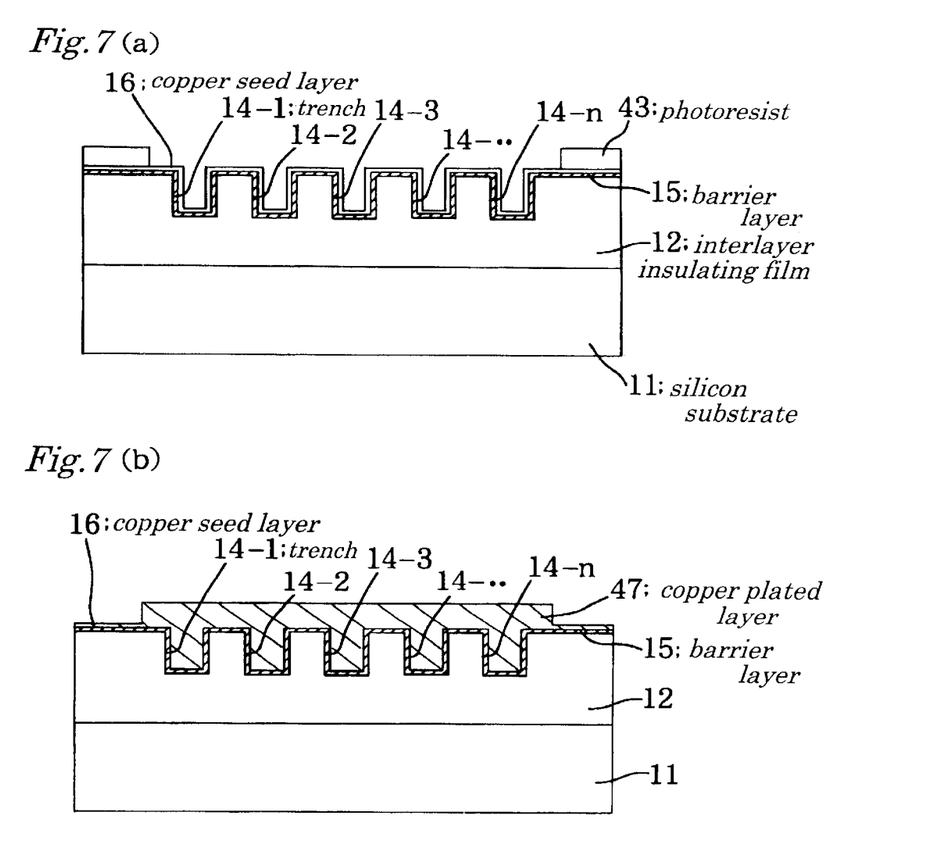
FIGS. 7(a), 7(b) are cross sections of successive processes illustrating a method of depositing a copper plated layer in a seventh embodiment of a method of manufacturing a semiconductor device of the present invention.

FIG. 7 is views of successive processes in cross sections for illustrating copper plated layer deposition according to a seventh preferred embodiment of the present invention.

A method of manufacturing a semiconductor device according to the present embodiment is sharply different from that of the first embodiment (FIGS. 1, 2, 3) in that a deposition prevention layer is formed on the interlayer insulating film other than the trenches and a peripheral area of the same with which layer a copper plated layer is not deposited, and the copper plated layer is deposited only on the trenches and on a peripheral area of the same.

For achieving the method of manufacturing a semiconductor device according to the present embodiment, the interlayer insulating film 12 is formed on the silicon substrate 11, over an entire area on which film a photoresist 13 is applied to form a resist pattern, and then the trenches 14-1 to 14-n are formed in the interlayer insulating film 12 and the photoresist 13 is removed, and further a barrier layer 15 is deposited, over an entire area of which a copper seed layer 16 is formed. The above description is substantially the same as that of the first embodiment.

As illustrated in FIG. 7(a), a photoresist 43 is applied on the surface of the silicon substrate 11 on which the copper seed layer 16 is formed, which photoresist is exposed to light and developed using a photolithography to form a photoresist pattern from which the trenches 14-1 to 14-n and a peripheral area of the same are removed.

Then, using a fountain plating apparatus 21 illustrated in FIG. 11 fountain plating is applied onto the silicon substrate 11 on which the resist pattern is formed with the copper seed layer 16 used as one electrode. Thereafter, the photoresist 43 is removed, and a copper plated layer 47 is deposited on the trenches 14-1 to 14-n and on a peripheral area of the same to form a structure, which layer has a protruded configuration (refer to FIG. 7(b)).

Then, like a process illustrated in FIG. 2(b), a silicon substrate surface on which the copper plated layer is deposited until the interlayer insulating film is exposed is polished using the CMP method, and the copper plated layer is left behind only in the trenches to form a buried wiring.

Thus, with the present construction, substantially the same effect as described above in the first embodiment is ensured.

Figure 8:
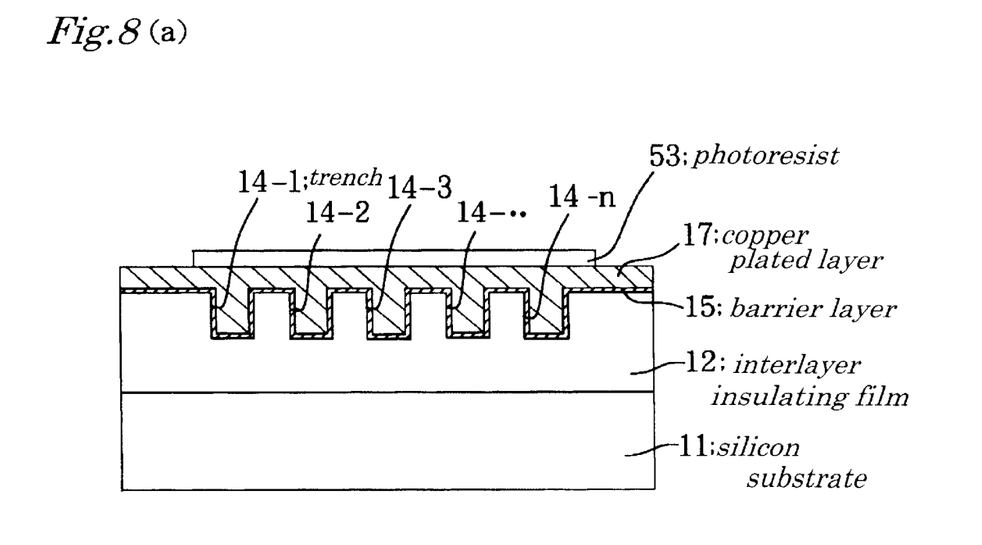
FIGS. 8(a), 8(b) are cross sections of successive processes illustrating a method of depositing a copper plated layer in an eighth embodiment of a method of manufacturing a semiconductor device of the present invention.

FIG. 8 is views of successive processes in cross sections for illustrating copper plated layer deposition according to an eighth preferred embodiment of the present invention.

A method of manufacturing a semiconductor device according to the present embodiment is sharply different from that of the first embodiment (FIGS. 1, 2, 3) in that after the copper plated layer is deposited on the interlayer insulating film which layer buries the trenches and has a substantially flat surface, a mask is formed, covering the copper plated layer on the trenches and on a peripheral area of the same, and the copper plated layer deposited other than on the trenches and a peripheral area of the same is made thinner to construct a structure where the copper plated layer is deposited on the trenches and on a peripheral area of the same, having a protruded configuration.

For achieving the method of manufacturing a semiconductor device according to the present embodiment, the interlayer insulating film 12 is formed on the silicon substrate 11, over an entire area on which film a photoresist 13 is applied to form a resist pattern, and then the trenches 14-1 to 14-n are formed along a wiring scheduled portion of the interlayer insulating film 12.

Thereafter, the photoresist 13 is removed, and a barrier layer 15 is deposited on side surfaces and a bottom surface in the trenches 14-1 to 14-n and on an entire area on the interlayer insulating film 12, over an entire area on which barrier layer a copper seed layer 16 is formed. Then, with the aid of a fountain plating method where the copper seed layer 16 is used as an electrode a copper plated layer 17 is deposited, which layer buries the trenches 14-1 to 14-n and has a substantially flat surface over a wide area on the interlayer insulating film 12. The construction up to here is substantially the same as the aforementioned prior method.

Then, as illustrated in FIG. 8(a), a photoresist 53 is applied on the surface of the silicon substrate 11 on which a substantially flat surface copper plated layer 17 is deposited, and is exposed to light and developed using a photolithography, and the photoresist 53 other than on the trenches 14-1 to 14-n and on a peripheral area of the same is removed and a resist pattern is formed where the resist is left behind only on the trenches 14-1 to 14-n.

Then, an exposed part of the copper plated layer 17 is etched and is made thinner using the resist pattern as a mask, and thereafter the photoresist 53 is removed to form a structure where the copper plated layer having a protruded configuration is deposited on the trenches 14-1 to 14-n and on a peripheral area of the same (refer to FIG. 8(b).).

Then, as in the process illustrated in FIG. 2(b), a silicon substrate surface on which the copper plated layer is polished using a CMP method until the interlayer insulating film is exposed, and the copper plated layer is left behind only in the trenches to form a buried wiring.

Thus, with the present exemplary construction, substantially the same effect as described above in the first embodiment is ensured.

It is noted here that the copper plated layer deposited and exposed other than on the trenches and on a peripheral area of the same may be made thinner using any method other than the aforementioned etching.

A method of manufacturing a semiconductor device according to a ninth embodiment is sharply different from that of the first embodiment (FIGS. 1, 2, 3) in that after a copper plated layer is deposited on the interlayer insulating film which layer buries the trenches and has a substantially flat surface, an entire area of the copper plated layer is etched back to make the film thickness thinner, and thereafter fountain plating is achieved under conditions where a plating speed at a high current density portion is higher to form a structure where the copper plated layer is deposited on the trenches and on a peripheral area of the same having a protruded configuration.

For achieving the present exemplary method of manufacturing a semiconductor device an interlayer insulating film is formed on a silicon substrate, and then a trench is formed in the interlayer insulating film. Thereafter, a barrier layer is deposited on side surfaces and a bottom surface in the trench and on an entire area on the interlayer insulating film, over an entire area on which layer a copper seed layer is formed. Then, a copper plated layer is deposited which buries the trench and has a substantially flat surface on said interlayer insulating film with the aid of a fountain plating method where the copper seed layer is used as an electrode. The description up to here is substantially the same as the aforementioned prior method.

Thereafter, the entire area of the copper plated layer is etched back into thin film thickness. Then, fountain plating is achieved by conducting a DC pulsed current (current patterns shown in FIGS. 3 and 4.) having a forwardly and backwardly alternately changing polarity using a plating solution containing a retarding agent or fountain plating is achieved by conducting a negative DC current or negative DC pulsed current (current patterns shown in FIGS. 5 and 6.) having a unidirectional polarity using a plating solution not containing a retarding agent.

In the combination of the plating pattern and the current pattern, after the substantially flat surface copper plated layer is deposited, the amount of the current is increased on the trench and on a peripheral area of the same where film thickness of copper is thicker than on the interlayer insulating film, on which portion a copper plated layer having a protruded configuration is formed. Then, as in the process illustrated in FIG. 2(b), a silicon substrate surface on which the copper plated layer is deposited until the interlayer insulating film is exposed is polished using the CMP method, and the copper plated layer is left behind only in the trench to form a buried wiring.

Thus, with the present exemplary construction, substantially the same effect as described above in the first embodiment is ensured.

A method of manufacturing a semiconductor device according to a tenth preferred embodiment is sharply different from that of the ninth embodiment in that although in the ninth embodiment after the copper plated layer is deposited on the interlayer insulating film which layer buries the trench and has a substantially flat surface, an entire area of the copper plated layer is etched back into thin film thickness, in the present embodiment a copper plated layer is deposited on the interlayer insulating film to be thinner which buries the trench and has a substantially flat surface. More specifically, since in the present embodiment the copper plated layer is deposited on the interlayer insulating film to be thin, there is unnecessary the processing in the ninth embodiment where the copper plated layer is etched back to make the film thickness of the copper plated layer thinner. Other than this are the same as in the ninth embodiment, and hence the description is not repeated.

Thus, with the present exemplary construction substantially the same effect as described above is ensured.

Although the preferred embodiments of the present invention are described in detail with reference to the accompanying drawings, the concrete construction is not limited to the embodiments, and the present invention includes any alteration of a design without departing the scope of the present invention.

For example, the depth, width, and interval of the trench is not limited to the above embodiments.

In the above embodiments the current pattern conducted until a substantially flat copper plated layer is deposited is not needed to be fixed, and the current pattern can be altered to prevent any void from being produced. Thereupon, it is important to keep the configuration of a copper deposit layer in a forward tapered configuration (wider than a bottom of the trench at an opening of the same) by altering the current pattern.

Although in the above embodiments deposition of the copper plated layer is achieved with the aid of the fountain plating, that may be achieved with electrical plating methods other than the fountain plating, e.g., with a dipping plating. As the metal material of the buried wiring there may be useable metals capable of plating, e.g., gold, silver, aluminum other than copper described above.

Although in the above embodiments the photoresist pattern is used as the deposition prevention layer for preventing the copper plated layer from being deposited on the interlayer insulating film other than on the trench and on a peripheral area of the same, other than this may be used. The method to make the film thickness thinner by depositing a substantially flat surface copper plated layer on the interlayer insulating film and then etching back an entire area of the copper plated layer may be achieved by methods other than the above etching. Further, flattening of the surface of the interlayer insulating film after the copper plated layer is buried in the trench may be achieved by methods other than the CMP method.

As described above, with the method of manufacturing a semiconductor device according to the present invention a trench is provided along a wiring scheduled portion of an insulating film, and a metal wiring material is buried in the trench and is deposited on the insulating film, to the surface of which material flattening is applied to form a buried wiring. Thereupon, erosion and dishing are prevented from happening to improve the freedom of a wiring design.

It is thus apparent that the present invention is not limited to the above embodiments but may be changed and modified without departing from the scope and spirit of the invention.

Finally, the present application claims the priority of Japanese Patent Application No.Hei10-038311 filed on Feb. 20, 1998, which is herein incorporated by reference.

What is claimed is:

1. In a method of manufacturing a semiconductor device comprising the steps of: providing a trench along a wiring scheduled portion of an insulating film formed on a substrate; forming a metal seed layer on the insulating film including said trench; forming a deposit layer of a metal wiring material on said metal seed layer to completely bury said trench with the aid of an electrical plating method where the metal seed layer is used as one electrode; and polishing and removing the deposit layer of the metal wiring material until the insulating film is again exposed, to form a buried wiring in said trench, the improvement being wherein the method further comprises the steps of: upon forming said buried wiring, protruding said deposit layer of the metal wiring material on said trench and on a peripheral area of the same into a protruded configuration by controlling a current of said electrical plating method; and polishing and removing said deposit layer until said insulating film is exposed; and wherein in said electrical plating a bidirectional current alternately temporarily changing in its flow direction is conducted until at least said trench is buried, and a unidirectional current not temporally changing in its flow direction is conducted to protrude said deposit layer of the metal wiring material on said trench and on a peripheral area of the same into a protruded configuration, and said deposit layer is polished and removed until said insulating film is exposed.

2. A method of manufacturing a semiconductor device according to claim 1 wherein said electrical plating is a fountain plating method where said plating solution is sprayed to said metal seed layer formed on said substrate in a fountain state.

3. In a method of manufacturing a semiconductor device comprising the steps of: providing a trench along a wiring scheduled portion of an insulating film formed on a substrate; forming a metal seed layer on the insulating film including said trench; forming a deposit layer of a metal wiring material on said metal seed layer to completely bury said trench with the aid of an electrical plating method where the metal seed layer is used as one electrode; and polishing and removing the deposit layer of the metal wiring material until the insulating film is again exposed, to form a buried wiring in said trench, the improvement being wherein the method further comprises the steps of: upon forming said buried wiring, protruding said deposit layer of the metal wiring material on said trench and on a peripheral area of the same into a protruded configuration by controlling a current of said electrical plating method; and polishing and removing said deposit layer until said insulating film is exposed; and wherein a unidirectional current not temporarily changing in its flow direction is conducted until at least said trench is buried and a bidirectional current alternately temporarily changing in its flow direction is conducted to protrude said deposit layer of the metal wiring material on said trench and on a peripheral area of the same into a protruded configuration, and said deposit layer is polished and removed until said insulating film is exposed.

4. In a method of manufacturing a semiconductor device comprising the steps of: providing a trench along a wiring scheduled portion of an insulating film formed on a substrate; forming a metal seed layer on the insulating film including said trench; forming a deposit layer of a metal wiring material on said metal seed layer with the aid of an electrical plating method where said metal seed layer is used as one electrode and a unidirectional current not temporarily changing in its flow direction, to bury said trench; and polishing and removing said deposit layer of the metal wiring material until said insulating film is again exposed to form a buried layer in said trench, the improvement wherein the method further comprises the steps of:

upon forming said buried wiring, protruding said deposit layer of the metal wiring material on said trench and on a peripheral area of the same into a protruded configuration by performing previous process electrical plating until at least said trench is buried using a first plating solution containing a retarding agent for preventing said metal wiring material from being deposited on a high current density portion on an exposed surface of said metal seed layer or said deposit layer and performing later process electrical plating using a second plating solution not containing said retarding agent; and polishing and removing said deposit layer until said insulating film is exposed.

5. A method of manufacturing a semiconductor device according to claim 4 wherein said electrical plating is a fountain plating method where said plating solution is sprayed to said metal seed layer formed on said substrate in a fountain state.

6. In a method of manufacturing a semiconductor device comprising the steps of: providing a trench along a wiring scheduled portion of an insulating film formed on a substrate; forming a metal seed layer on the insulating film including said trench; forming a deposit layer of a metal wiring material on said metal seed layer to bury said trench with the aid of an electrical plating method where said metal seed layer is used as one electrode and a bidirectional current alternately temporally changing in its flow direction; and polishing and removing said deposit layer of the metal wiring material until said insulating film is exposed to form a buried wiring in said trench, the improvement wherein the method further comprises the steps of:

upon forming said buried wiring, protruding said deposit layer of the metal wiring material on said trench and on a peripheral area of the same into a protruded configuration by first achieving previous process electrical plating until at least said trench is buried using a second plating solution not containing a retarding agent for preventing said metal wiring material from adhering to a high current density portion on an exposed surface of said metal seed layer or said deposit layer and achieving later process electrical plating using a first plating solution containing said retarding agent; and polishing and removing said deposit layer until said insulating film is exposed.

7. A method of manufacturing a semiconductor device according to claim 6 where said electrical plating is a fountain plating method where said plating solution is sprayed to said metal seed layer formed on said substrate in a fountain state.

8. In a method of manufacturing a semiconductor device comprising the steps of: providing a trench along a wiring scheduled portion of an insulating film formed on a substrate; forming a metal seed layer on the insulating film including said trench; forming a deposit layer of a metal wiring material on said metal seed layer to bury said trench with the aid of an electrical plating method where said metal seed layer is used as one electrode; and polishing and removing said deposit layer of the metal wiring material until said insulating film is again exposed, the improvement being wherein the method further comprises the steps of:

upon forming said buried wiring, forming said deposit layer of the metal wiring material on said insulating film with the aid of said electrical plating method or forming said deposit layer of the metal wiring material on said insulating film with the aid of said electrical plating method until at least the trench is completely buried and etching back said deposit layer;

protruding said deposit layer of the metal wiring material on said trench and on a peripheral area of the same into a protruded configuration with the aid of electrical plating where a bidirectional current alternately temporally changing in its flow direction using a first plating solution containing a retarding agent for preventing said metal seed material from adhering to a high current density portion on an exposed surface of said metal seed layer or said deposit layer; and polishing and removing said deposit layer until said insulating film is removed.

9. In a method of manufacturing a semiconductor device comprising the steps of: providing a trench along a wiring scheduled portion of an insulating film formed on a substrate; forming a metal seed layer on the insulating film including said trench; forming a deposit layer of a metal wiring material on said metal seed layer to bury said trench with the aid of an electrical plating method where said metal seed layer is used as one electrode; and polishing and removing said deposit layer of the metal wiring material until said insulating film is exposed to form a buried wiring in said trench, the improvement being wherein the method further comprises the steps of:

upon forming said buried wiring, first forming said deposit layer of the metal wiring material on said insulating film with the aid of said electrical plating method until at least the trench is completely buried; or forming said deposit layer of the metal wiring material on said insulating film with the aid of said electrical plating method until at least the trench is completely buried; and etching back said deposit layer;

protruding said deposit layer of the metal wiring material on said trench and on a peripheral area of the same into a protruded configuration by performing electrical plating where a unidirectional current not changing in its flow direction using a second plating solution not containing a retarding agent for preventing said metal wiring material from adhering to a high current density portion on an exposed surface of said metal seed layer or said deposit layer; and polishing and removing said deposit layer until said insulating film is exposed.

* * * * *